(12) United States Patent
Kimoto

(10) Patent No.: US 10,701,846 B1
(45) Date of Patent: Jun. 30, 2020

(54) ELECTROMAGNETIC SHIELD COMPONENT AND WIRE HARNESS

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Yuichi Kimoto, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/615,945

(22) PCT Filed: Jun. 11, 2018

(86) PCT No.: PCT/JP2018/022231
§ 371 (c)(1),
(2) Date: Nov. 22, 2019

(87) PCT Pub. No.: WO2019/003883
PCT Pub. Date: Jan. 3, 2019

(30) Foreign Application Priority Data

Jun. 27, 2017 (JP) ................ 2017-125406

(51) Int. Cl.
*H05K 9/00* (2006.01)
*H02G 3/04* (2006.01)
*H01B 7/20* (2006.01)

(52) U.S. Cl.
CPC ............ *H05K 9/0009* (2013.01); *H01B 7/20* (2013.01); *H02G 3/04* (2013.01); *H05K 9/0049* (2013.01); *H05K 9/0098* (2013.01)

(58) Field of Classification Search
CPC .......................... H05K 9/0098; H05K 9/0009
See application file for complete search history.

(56) References Cited

U.S. PATENT DOCUMENTS 5,287,074 A * 2/1994 Meguro ............... H03H 1/0007
333/12
9,781,868 B2 * 10/2017 Wakabayashi ....... H05K 1/0228
(Continued)

FOREIGN PATENT DOCUMENTS

| JP | 2015-165468 A | 9/2015 |
| JP | 2018-113173 | * 7/2018 |
| WO | 2017/073281 A1 | 5/2017 |

OTHER PUBLICATIONS

Aug. 28, 2018 International Search Report issued in International Patent Application No. PCT/JP2018/022231.

*Primary Examiner* — Hung V Ngo
(74) *Attorney, Agent, or Firm* — Oliff PLC

(57) ABSTRACT

An electromagnetic shield component that includes a tube that is electrically conductive and into which an electrical wire is to be inserted, wherein the tube includes a first half tube that has a shape of a half tube, a second half tube that has a shape of a half tube, and welds where both ends of the first half tube in a circumferential direction and both ends of the second half tube in the circumferential direction are welded to each other, an inner circumferential surface of the first half tube is provided with extensions that extend inward from the inner circumferential surface of the first half tube, in a radial direction of the tube, toward the second half tube, and portions of the extensions that face the welds in the (Continued)

radial direction are provided such that gaps are formed between the portions and the welds.

6 Claims, 3 Drawing Sheets

(56) References Cited

U.S. PATENT DOCUMENTS

| | | | |
|---|---|---|---|
| 10,147,514 B2* | 12/2018 | Sugino | H01B 7/0045 |
| 10,586,630 B2* | 3/2020 | Sugino | H01B 7/1805 |
| 10,602,647 B2* | 3/2020 | Kimoto | H01R 13/6592 |
| 2010/0126752 A1* | 5/2010 | Watanabe | H05K 9/0098 |
| | | | 174/102 D |
| 2013/0333936 A1* | 12/2013 | Gundel | H05K 9/0064 |
| | | | 174/350 |
| 2015/0250079 A1 | 9/2015 | Sugino et al. | |
| 2018/0301242 A1 | 10/2018 | Sugino | |
| 2019/0089142 A1* | 3/2019 | Sugino | B60R 16/0215 |
| 2019/0140433 A1* | 5/2019 | Sugino | H01B 7/0045 |

\* cited by examiner

ELECTROMAGNETIC SHIELD COMPONENT AND WIRE HARNESS

BACKGROUND

The present disclosure relates to an electromagnetic shield component and a wire harness.

Conventionally, in some wire harnesses that are to be mounted on a vehicle, electrical wires are enclosed by an electromagnetic shield component, in order to address the issue of electromagnetic noise (for example, see JP 2015-165468A).

Such an electromagnetic shield component includes an electrically-conductive tubular member, and the tubular member has been subjected to bending processing so as to have a predetermined shape that matches the routing path of electrical wires. The tubular member is formed by welding a pair of half tube members to each other.

SUMMARY

If half tube members are employed, it is possible to position electrical wires in the internal space of the tubular member that is formed from the two half tube members, before welding the half tube members to each other. However, if the two half tube members are welded to teach other in a state in which electrical wires are enclosed by the two half tube members that have not been welded to each other, there is the risk of the electrical wires in the internal space being damaged.

An exemplary aspect of the disclosure provides an electromagnetic shield component and a wire harness that can prevent electrical wires from being damaged.

An electromagnetic shield component according to an exemplary aspect includes a tube that is electrically conductive and into which an electrical wire is to be inserted, wherein the tube includes a first half tube that has a shape of a half tube, a second half tube that has a shape of a half tube, and welds where both ends of the first half tube in a circumferential direction and both ends of the second half tube in the circumferential direction are welded to each other, an inner circumferential surface of the first half tube is provided with extensions that extend inward from the inner circumferential surface of the first half tube, in a radial direction of the tube, toward the second half tube, and portions of the extensions that face the welds in the radial direction are provided such that gaps are formed between the portions and the welds.

In this configuration, the inner circumferential surface of the first half tube is provided with extensions that extend inward from the inner circumferential surface, in a radial direction of the tube, toward the second half tube, and portions of the extensions that face the welds in the radial direction are provided such that gaps are formed between the portions and the welds. As a result, heat (energy) supplied from a heat source (an energy source) when the ends in the circumferential direction are welded to each other is prevented from being directly supplied to the electrical wire, and thus the electrical wire is prevented from being damaged. Also, sputter that may occur when welding is performed can be received by the extensions, and therefore the electrical wire is prevented from being damaged by sputter.

In the above-described electromagnetic shield component, it is preferable that the extensions are formed at both ends of the first half tube in the circumferential direction, each of the extensions has a leading end surface that is orientated outward in the radial direction, at a leading end of the extensions in a direction in which the extensions extends, and at least a portion of the leading end surface abuts against an inner circumferential surface of the second half tube.

With this configuration, a portion of the leading end surface of each of the extensions formed at both ends of the first half tube in the circumferential direction abuts against the inner circumferential surface of the second half tube, and therefore, in a state where the ends of the half tubes in the circumferential direction abut against each other, the protruding portions provided for the first half tube restrict the second half tube from moving, and displacement is prevented when welding is performed.

In the above-described electromagnetic shield component, it is preferable that each of the extensions has a leading end surface that faces the inner circumferential surface of the second half tube, at a leading end of the extensions in a direction in which the extensions extend, and the leading end surface is formed so as to fit the inner circumferential surface of the second half tube that the leading end surface faces.

In this configuration, each of the extensions has a leading end surface that faces the inner circumferential surface of the second half tube, at a leading end of the extensions in a direction in which the extensions extend, and the leading end surface is formed so as to fit the inner circumferential surface of the second half tube that the leading end surface faces. Therefore, when the first half tube and the second half tube are placed so as to face each other and the ends in the circumferential direction are brought closer to each other, the ends of the second half tube, which are not provided with extensions, abut against the leading end surfaces of the extensions provided for the first half tube, the ends can be guided outward in the radial direction.

In the above-described electromagnetic shield component, it is preferable that each of the extensions extend so as to curve from the inner circumferential surface of the first half tube toward the inner circumferential surface of the second half tube.

In this configuration, the extensions are formed so as to curve, and therefore it is possible to prevent degradation in processability when the tube is subjected to bending processing.

A wire harness according to an exemplary aspect includes any of the above-described electromagnetic shield components and at least one electrical wire that is inserted into the electromagnetic shield component.

With this configuration, it is possible to provide a wire harness that achieves the same effects as any of the above-described effects.

In the above-described wire harness, it is preferable that the at least one electrical wire is a plurality of electrical wires that are inserted into the electromagnetic shield component, and the extensions are positioned so as to extend in a direction that intersects a direction in which the plurality of electrical wires are arranged side by side.

In this configuration, the extensions are provided so as to extend in a direction that intersects the direction in which the plurality of electrical wires are arranged side by side, and therefore the extensions are prevented from interfering with the electrical wires, compared to when the extensions are provided so as to extend in the direction in which the electrical wires are arranged side by side, for example. That is to say, if the tube is formed so as to have a substantially true circle shape, it is possible to efficiently use the internal space of the tube, and thus it is possible to suppress an increase in the size of the tube.

With the electromagnetic shield component and the wire harness according to the present disclosure, it is possible to prevent electrical wires from being damaged.

DETAILED DESCRIPTION OF EMBODIMENTS

The following describes an embodiment of a wire harness with reference to the drawings. Note that, in each drawing, for the sake of description, some of the components may be exaggerated or simplified. Also, the dimensional ratio of each part may differ from the actual ratio thereof.

Figure 1:
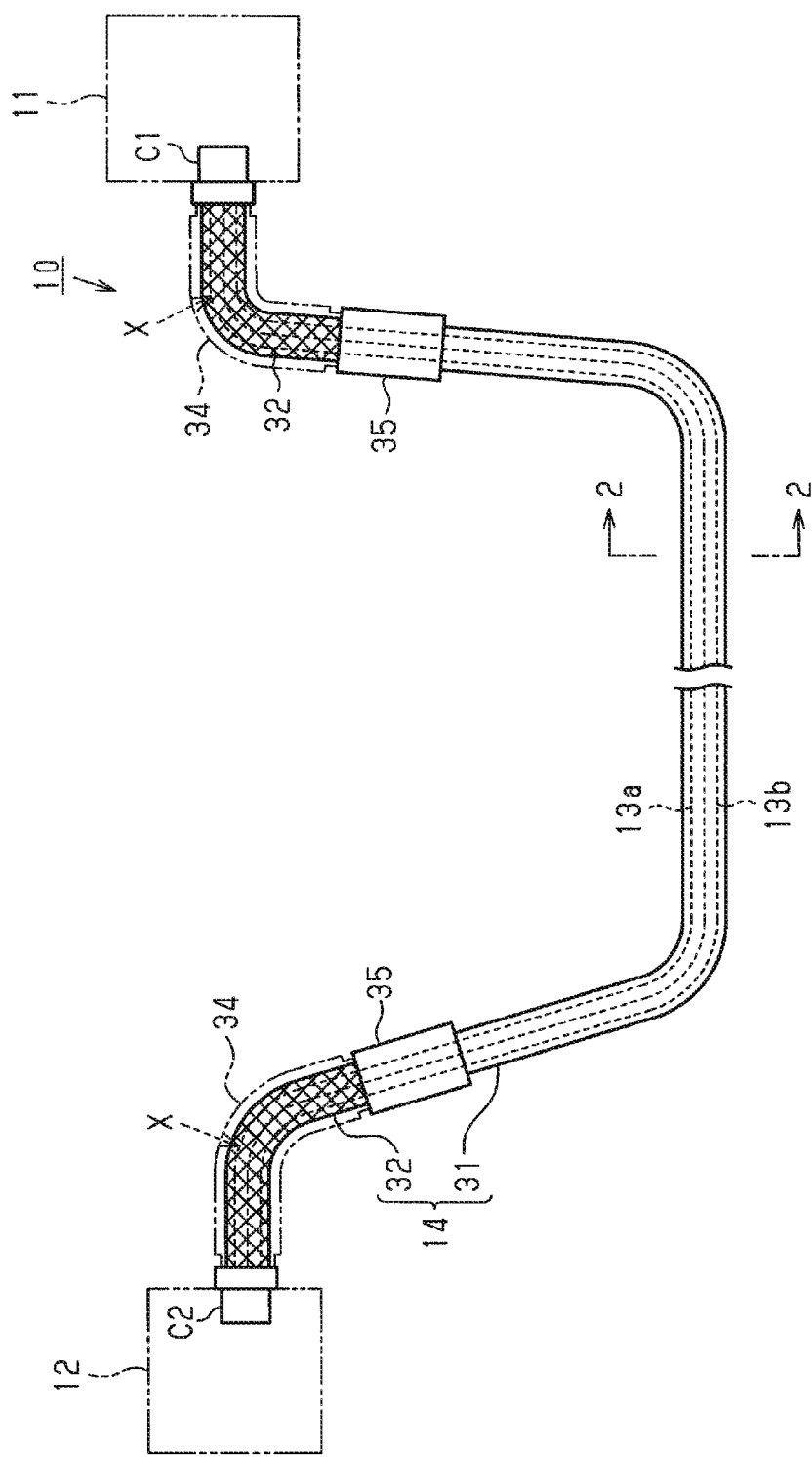
FIG. 1 shows an overall configuration of a wire harness according to an embodiment.

As shown in FIG. 1, a wire harness 10 according to the present embodiment is routed in a hybrid vehicle, an electric vehicle, or the like, under the floor or the like of the vehicle so as to connect a high-voltage battery 11 that is provided in a rear portion of the vehicle, and an inverter 12 that is provided in a front portion of the vehicle, to each other. The inverter 12 is connected to a wheel drive motor (not shown), which is a power source for the vehicle's travel. The inverter 12 generates AC power from DC power that is supplied from the high-voltage battery 11, and supplies the AC power to the motor. The high-voltage battery 11 is a battery that can supply a voltage of several hundred volts.

The wire harness 10 includes two high-voltage electrical wires 13a and 13b to which the positive terminal and the negative terminal of the high-voltage battery 11 are respectively connected, and an electromagnetic shielding component 14 that is tubular and encloses the high-voltage electrical wires 13a and 13b together.

Figure 2:
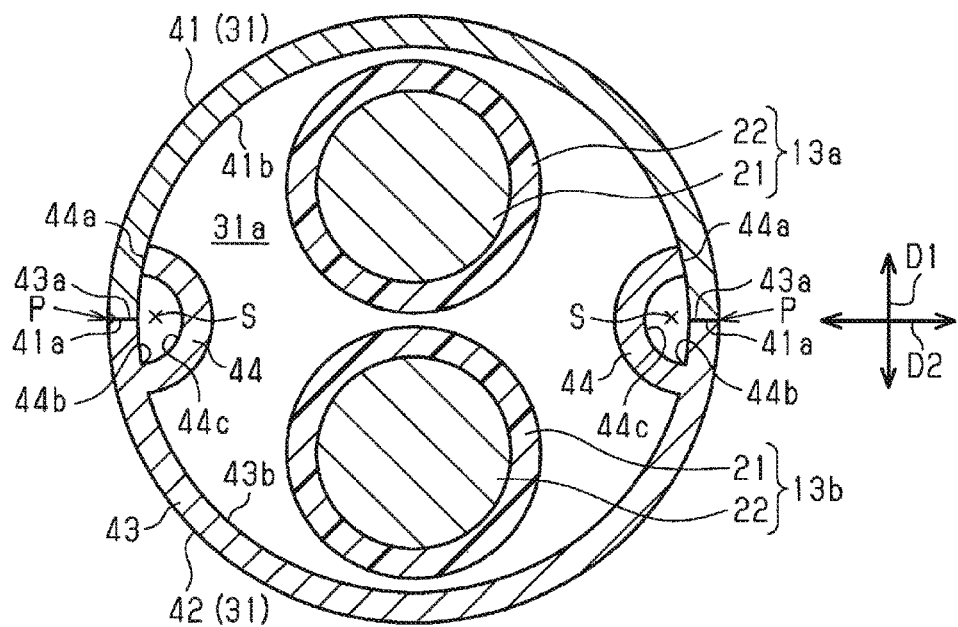
FIG. 2 is a cross-sectional view of the wire harness taken along a line 2-2 in FIG. 1.

As shown in FIG. 2, each of the high-voltage electrical wires 13a and 13b is a coated electrical wire in which a core wire 21 that is made of a conductive material is coated with an insulation coating 22 that is made of a resin material. The insulation coating 22 is formed as an extrusion coating on the outer circumferential surface of the core wire 21, and coats the outer circumferential surface of the core wire 21 in an intimate contact state.

The high-voltage electrical wires 13a and 13b are non-shielded wires that do not have their own shield structures, and are electrical wires that can handle a high voltage and a large current. Each of the high-voltage electrical wires 13a and 13b is inserted into the electromagnetic shielding component 14. Also, one end of each of the high-voltage electrical wires 13a and 13b is connected to the high-voltage battery 11 via a connector C1, and the other end is connected to the inverter 12 via a connector C2.

The electromagnetic shielding component 14 has an elongated tubular shape overall. The electromagnetic shielding component 14 includes a metal pipe 31 that is located on an intermediate portion thereof in the lengthwise direction, and braided members 32 that are located in ranges other than the portion constituted by the metal pipe 31 and include both ends in the lengthwise direction.

The metal pipe 31 is made of an aluminum-containing metal material, for example. The metal pipe 31 is routed under the floor of the vehicle, and is bent so as to have a predetermined shape corresponding to the configuration of the area under the floor. The metal pipe 31 electromagnetically shields the high-voltage electrical wires 13a and 13b together, which are inserted thereinto, and protects the high-voltage electrical wires 13a and 13b from a flung stone or the like.

As shown in FIG. 2, the metal pipe 31 according to the present embodiment includes a half tube 41 that has the shape of a half tube, and a half tube 42 that has the shape of a half tube.

The half tubes 41 and 42 are made of an aluminum-containing metal material.

The half tube 41 has the shape of a half tube, and is open in one direction. The shape of a cross section of the half tube 41 that is orthogonal to the direction in which the half tube 41 extends is a semicircular shape, for example.

The half tube 42 includes a main portion 43 that has the shape of a half tube, and extension portions 44 that respectively extend from positions near two end portions 43a of an inner circumferential surface 43b of the main portion 43 in the circumferential direction of the main portion 43. The shape of a cross section of the main portion 43 that is orthogonal to the direction in which the main portion 43 extends is a semicircular shape, for example. The half tubes 41 and 42 are formed through extrusion molding, for example.

The pair of half tubes 41 and 42 are combined together such that both end portions 41a of the half tube 41 in the circumferential direction thereof and both end portions 43a of the main portion 43 of the half tube 42 in the circumferential direction thereof abut against each other. Specifically, both end portions 41a of the half tube 41 in the circumferential direction thereof are welded to both end portions 43a of the half tube 42 in the circumferential direction thereof, and thus the pair of half tubes 41 and 42 are combined together. The welded portions P where the end portions 41a and the end portions 43a are welded to each other are formed over the entire length of the half tubes 41 and 42 in the direction in which the half tubes 41 and 42 extend. The end portions 41a and 43a of the pair of half tubes 41 and 42 are sealed by these welded portions P. Thus, the metal pipe 31 that has a substantially true cylinder shape.

As shown in FIG. 2, the extension portions 44 are formed so as to have a shape that is curved from the half tube 42 side (the main portion 43 side) toward an inner circumferential surface 41b of the half tube 41. That is to say, the shape of a cross section of each extension portion 44 (the shape of a cross section that is orthogonal to the direction in which the half tubes 41 and 42 extend) is an arc shape. The extension portions 44 are formed over the entire length of the half tube 42 in the direction in which the half tube 42 extends.

Each extension portion 44 is formed such that a gap S is formed between a welded portion P and an inner portion, which faces the welded portion P, of the extension portion 44 in a radial direction of the metal pipe 31a. The extension portions 44 are formed such that leading end surfaces 44a of the extension portions 44 extend to abut against the inner circumferential surface 41b of the half tube 41 in a state in which the half tubes 41 and 42 are welded to each other. The leading end surfaces 44a of the extension portions 44 that each have a curved shape are formed so as to fit the inner circumferential surface 41b of the half tube 41 that the leading end surfaces 44a face (abut). In this example, the shape with which the leading end surfaces 44a fit the inner circumferential surface 41b may be a curved shape or a flat shape.

The leading end surfaces 44a are formed so as to fit the inner circumferential surface 41b of the half tube 41, and are thus orientated toward the outside of the metal pipe 31 in a radial direction thereof. The leading end surfaces 44a of the extension portions 44 are flat surfaces that extend in a direction that intersect a direction D1 in which the half tubes 41 and 42 face each other, and that intersects a direction D2 that is orthogonal to the facing direction D1. The leading end surfaces 44a of the extension portions 44 are formed such that the shorter the distance from the half tube 41 in the direction D1 in which the half tubes 41 and 42 face each other is, the longer the distance from the end portions 41a of the half tube 41, toward which the extension portions 44 extend, in the direction D2 is, where the direction D2 is orthogonal to the facing direction D1 and is orthogonal to the direction in which the electrical wires 13a and 13b are inserted.

The thickness of the extension portions 44 is preferably set so as to fall within the range from substantially a half of the thickness of the main portion 43 to substantially the same as the thickness of the main portion 43, for example. Here, if the thickness of the extension portions 44 is greater than the thickness of the main portion 43 or smaller than a half of the thickness of the main portion 43, there is the risk of creases or the like being formed in the inner side of the metal pipe 31 when the metal pipe 31 is subjected to bending processing. Also, if the radius of curvature of the extension portions 44 is extremely small or extremely large, there is the risk of creases or the like being formed when the metal pipe 31 is subjected to bending processing. Therefore, it is also preferable that the radius of curvature of the extension portions 44 is set such that creases or the like are not to be formed.

The extension portions 44 are positioned in the direction (the same direction as the direction D1) that is orthogonal to the direction in which the two high-voltage electrical wires 13a and 13b are arranged side by side (the same direction as the direction D2). This configuration makes it possible to efficiently use the internal space of the metal pipe 31.

As shown in FIG. 1, the outer circumference of each braided member 32 is enclosed by an exterior material 34 such as a corrugated tube. Grommets 35 that are made of rubber are attached to connection positions where the metal pipe 31 and the braided members 32 are connected, to cover the outer circumferences of the connection positions and prevent water from entering.

The high-voltage electrical wires 13a and 13b are led out from the two end portions of the metal pipe 31, and may have portions that are not covered by the metal pipe 31 (outside-the-pipe portions X). The braided members 32 enclose the outer circumferences of the outside-the-pipe portions X of the high-voltage electrical wires 13a and 13b together. Thus, the outside-the-pipe portions X of the high-voltage electrical wires 13a and 13b are electromagnetically shielded by the braided members 32.

Next, a method for manufacturing the wire harness 10 (the metal pipe 31) according to the present embodiment will be described.

Figure 3:
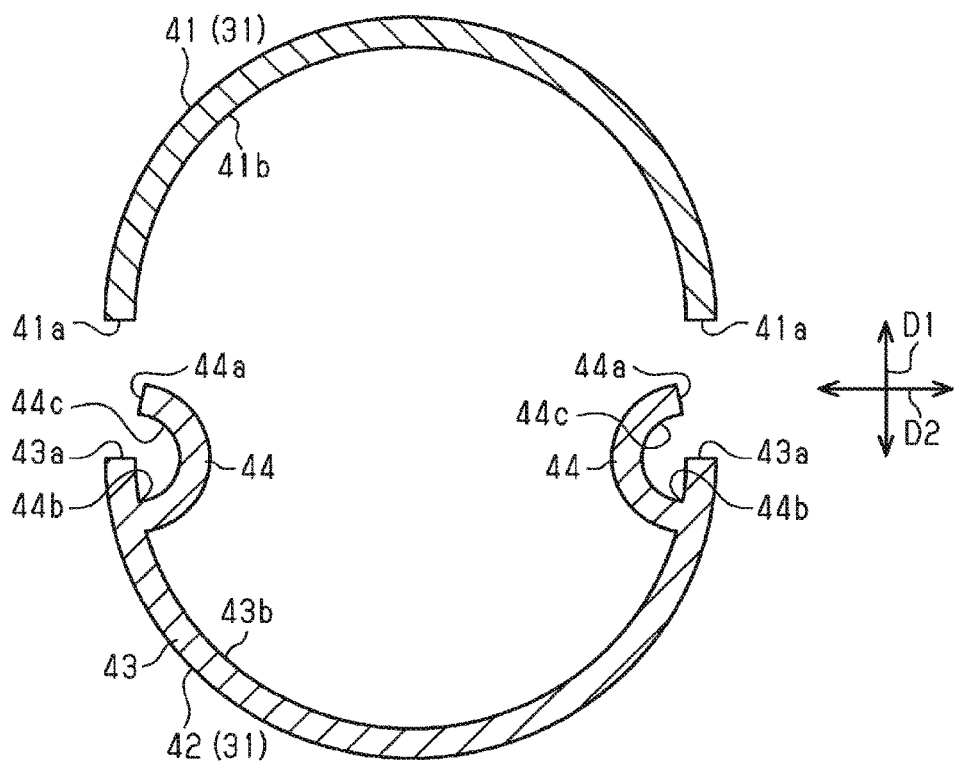
FIG. 3 is a cross-sectional view illustrating a method for manufacturing a metal pipe according to the embodiment.

As shown in FIG. 3, both end portions 41a of the half tube 41 in the circumferential direction thereof and both end portions 43a of the main portion 43 of the half tube 42 in the circumferential direction thereof are positioned so as to face each other.

Next, the end portions 41a of the half tube 41 and the end portions 43a of the main portion 43 of the half tube 42 are moved relative to each other in the direction D1 until they abut against each other. At this time, for example, upon the end portions 41a of the half tube 41 coming into contact with the leading end surfaces 44a of the extension portions 44, the end portions 41a of the half tube 41 are guided outward in a radial direction of the metal pipe 31 by the leading end surfaces 44a. In a state in which the end portions 41a and 43a abut against each other in the direction D1, the leading end surfaces 44a of the extension portions 44 on the half tube 42 side abut against the inner circumferential surface 41b of the half tube 41. As a result, even if a force is applied to cause relative movement in the direction D2 that is orthogonal to the direction D1 in which the half tube 41 and the half tube 42 face each other, the extension portions 44 (the leading end surfaces 44a) and the inner circumferential surface 41b abut against each other, and relative displacement in the direction D2 is prevented.

In a state in which the end portions 41a of the half tube 41 and the end portions 43a of the main portion 43 of the half tube 42 abut against each other, the end portions 41a and 43a are supplied (irradiated) with heat (energy) of a laser or the like and are welded to each other. Thus, the metal pipe 31 is complete. At this time, if heat is supplied such that the entire bodies of the end portions 41a and 43a are welded to each other, heat reaches positions that are inward of the end portions 41a and 43a in a radial direction. However, such heat is absorbed by the extension portions 44, and is thus prevented from reaching the high-voltage electrical wires 13a and 13b inside. In the same manner, there is a concern about sputter or the like occurring when welding is performed. However, even if supper occurs, the extension portions 44 receive sputter. Thus, the extension portions 44 prevent the high-voltage electrical wires 13a and 13b from being damaged.

Next, the effect of the present embodiment will be described.

(1) The inner circumferential surface 43b of the half tube 42 (the main portion 43) is provided with the extension portions 44 that extend inward from the inner circumferential surface 43b, in a radial direction of the metal pipe 31, toward the half tube 41, and the gaps S are formed between the welded portions P and the portions of the extension portions 44 that face the welded portions P in a radial direction. With this configuration, heat (energy) of a laser or the like supplied from a heat source when the end portions 41a and 43a are welded to each other is prevented from being directly supplied to the electrical wires 13a and 13b. Thus, the high-voltage electrical wires 13a and 13b are prevented from being damaged. Also, sputter that may occur when welding is performed can be received by the extension portions 44, and therefore the high-voltage electrical wires 13a and 13b can be prevented from being damaged by sputter.

(2) The leading end surfaces 44a of the extension portions 44 formed at both end portions 43a of the half tube 42 (the main portion 43) in the circumferential direction thereof abut against the inner circumferential surface 41b of the half tube 41. Therefore, in a state in which both end portions 41a and both end portions 43a of the half tubes 41 and 42 in the circumferential direction abut against each other, the extension portions 44 provided for the half tube 42 can prevent the half tube 41 from moving. Thus, displacement can be prevented when welding is performed.

(3) The extension portions 44 are provided with the leading end surfaces 44a that face toward the inner circumferential surface 41b of the half tube 41, at the leading ends in the direction in which the extension portions 44 extend, and the leading end surfaces 44a are formed so as to fit the inner circumferential surface 41b of the half tube 41 that the leading end surfaces 44a face. Therefore, when the half tube 41 and the half tube 42 are placed so as to each other and both end portions 41a and both end portions 43a in the circumferential direction are brought close to each other, the end portions 41a of the half tube 41 can be guided outward in a radial direction when the end portions 41a, which are not provided with the extension portions 44, come into contact with the leading end surfaces 44a of the extension portions 44 provided on the half tube 42 (the main portion 43).

(4) The extension portions 44 are formed so as to curve, and therefore it is possible to prevent degradation in processability when the metal pipe 31 is subjected to bending processing.

(5) The extension portions 44 are provided so as to extend in a direction that intersects the direction in which the plurality of high-voltage electrical wires 13a and 13b are arranged side by side, and therefore the extension portions 44 are prevented from interfering with the high-voltage electrical wires 13a and 13b, compared to when the extension portions 44 are provided so as to extend in the direction in which the high-voltage electrical wires 13a and 13b are arranged side by side. That is to say, if the metal pipe 31 is formed so as to have a substantially true circle shape, it is possible to efficiently use the internal space of the metal pipe 31, and thus it is possible to suppress an increase in the size of the tubular member.

Note that the above-described embodiment may be modified as follows.

Figure 4:
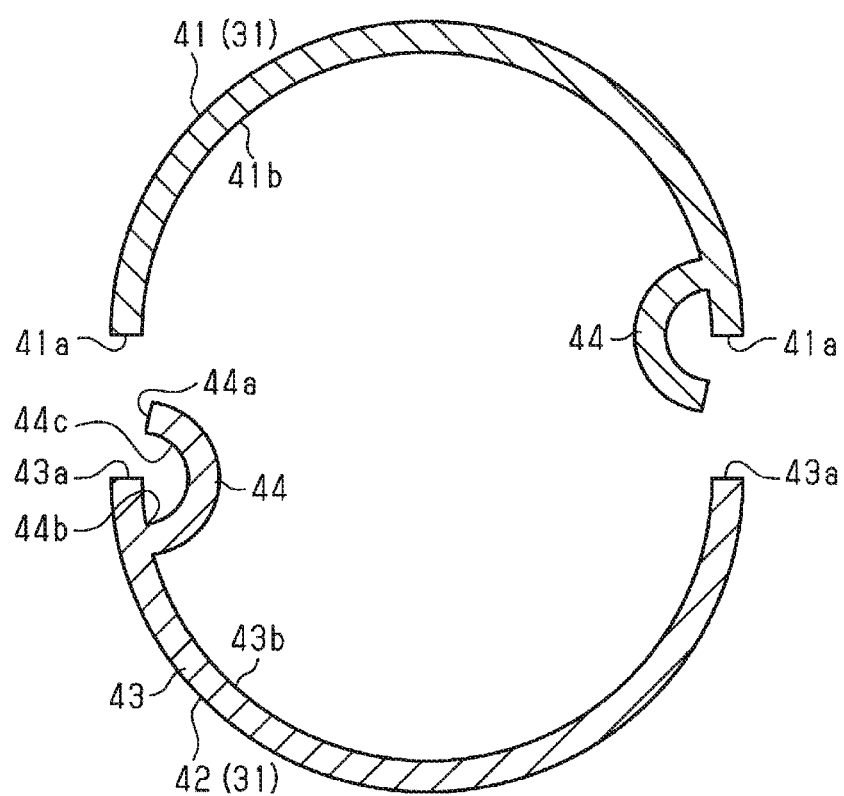
FIG. 4 is a cross-sectional view illustrating a metal pipe according to a modification.

In the above-described embodiment, the extension portions 44 are provided near both end portions 43a of the half tube 42 of the extension portions 44 in the circumferential direction thereof. However, the present disclosure is not limited to such a configuration. For example, the extension portions 44 may be provided near both end portions 41a of the half tube 41 in the circumferential direction thereof. Also, as shown in FIG. 4, it is possible to employ a configuration in which one extension portion 44 is provided for each of the half tubes 41 and 42.

In the above-described embodiment, the leading end surfaces 44a of the extension portions 44 abut against the inner circumferential surface 41b of the half tube 41. However, the present disclosure is not limited to such a configuration. For example, it is possible to employ a configuration in which the leading end surfaces 44a of the extension portions 44 are separated from the inner circumferential surface 41b, such as a configuration in which the leading end surfaces 44a are located near the inner circumferential surface 41b of the half tube 41.

In the above-described embodiment, the leading end surfaces 44a of the extension portions 44 have a shape that fits the inner circumferential surface 41b of the hall tube 41. However, the present disclosure is not limited to such a configuration. For example, the leading end surfaces 44a may be formed so as to face inward in a radial direction, face in a direction that is parallel with the direction D1, or face in a direction that is parallel with the direction D2.

In the above-described embodiment, the leading end surfaces 44a are flat surfaces. However, another shape such as a curved shape may be employed.

In the above-described embodiment, the extension portions 44 are formed so as to have a curved shape (an arc shape). However, the present disclosure is not limited to such a configuration, and the extension portions 44 may have a cross section with a straight section, such as an L-shaped or V-shaped cross section.

In the above-described embodiment, the half tube 41 and the half tube 42 (the main portion 43) are formed so as to have a half cylinder shape, and the metal pipe 31 is thus formed so as to have a true circle shape. However, the present disclosure is not limited to such a configuration. The shape of the half tube 41 and the half tube 42 may be modified as appropriate such that the metal pipe 31 has a shape other than a true circle shape, such as an ellipsoidal shape or an oval shape.

In the above-described embodiment, both end portions of the half tubes 41 and 42 in the circumferential direction face each other. However, it is possible to employ a configuration in which the end portions in the circumferential direction may overlap each other in a radial direction.

In the wire harness 10 according to the above-described embodiment, the two high-voltage electrical wires 13a and 13b are inserted into the electromagnetic shielding portion 14. However, the configuration of the electrical wires that are inserted into the electromagnetic shielding portion 14 may be changed as appropriate according to the configuration of the vehicle. For example, low-voltage electrical wires for power supply that connect a low-voltage battery of a rated voltage of 12 V or 24 V, for example, and various low-voltage devices (such as a lamp and a car audio device) to drive the various low-voltage devices may be added as electrical wires that are inserted into the electromagnetic shielding component 14.

The positional relationship between the high-voltage battery 11 and the inverter 12 in the vehicle is not limited to that in the above-described embodiment, and may be changed as appropriate according to the configuration of the vehicle. Also, although the high-voltage battery 11 is connected to the inverter 12 via the high-voltage electrical wires 13a and 13b in the above-described embodiment, the high-voltage battery 11 may be connected to a high-voltage device other than the inverter 12.

In the above-described embodiment, the present disclosure is applied to the wire harness 10 that connects the high-voltage battery 11 and the inverter 12 to each other. However, instead, the present disclosure may be applied to a wire harness that connects the inverter 12 and a vehicle drive motor.

The above-described embodiment and modifications may be combined as appropriate.

It is preferable that the half tube 42 is formed so as to be one piece that includes the main portion (half tube member) 43 and the extension portions 44. The half tube 42 may be formed by fixing the extension portions 44 to the main portion 43 before welding the half tubes 41 and 42 to each other.

The end portions 41a and 43a of the half tubes 41 and 42 may also be referred to as joint portions. The welded portions P may be welding spots or welding seams.

The extension portions 44 contactlessly cover the welded portions P, and function as barrier portions that protect the electrical wires 13a and 13b from sputter that may occur when welding is performed. The extension portions 44 may be formed as protruding portions that each include a base end 44b and a free end 44a. Each extension portion 44 may include the base end 44b at a first position that is displaced from the end portions 43a of the half tube 42, on the inner circumferential surface 43b of the half tube 42. Each extension portion 44 may have a sputter receiving surface, which may be a recessed curving surface 44c that spreads from the base end 44b toward the leading end surface 44a so as to contactlessly cover the end portion 43a of the half tube 42, i.e. the welded portion P.

When the two half tubes 41 and 42 are to be assembled, the leading end surfaces 44a of the extension portions 44 may function as positioning surfaces that position the two half tubes 41 and 42 relative to each other, by temporarily or continuously coming into contact with the inner circumferential surface 41b of the half tube 41. With these leading end surfaces 44a, it is possible to stably assemble the half tubes 41 and 42, and it is easier to perform assembling. The leading end surfaces 44a of the extension portions 44 may also be referred to as free ends.

The gap S in the embodiment may also be referred to as an empty sub space that is cooperatively defined by the extension portions 44, a portion of the inner circumferential surface 43b of the main portion 43 of the half tube 42, and a portion of the inner circumferential surface 41b of the half tube 41. The extension portions 44 may be formed as a partition wall that separates the sub space S and the internal space 31a of the metal pipe 31.

The present disclosure includes the following implementation examples. The reference signs of the constituent elements of the embodiment are provided in order to facilitate understanding of the present disclosure, but there is no intention to limit the present disclosure.

Implementation Example 1

An electromagnetic shield component (14) including two half tube members (41, 42),
wherein each of the half tube members (41, 42) include two end portions (35) in a lengthwise direction, and a first joint portion (41a, 43a) and a second joint portion (41a, 43a) that are two end portions in a circumferential direction, and the respective first joint portions (41a, 43a) and the respective second joint portions (41a, 43a) of the two half tube members are connected and welded to each other so that a tube member (31) is formed from the two half tube members, and
a plurality of barrier portions (44) that are housed in the internal space (31a) of the tube member (31) and contactlessly cover the respective first joint portions (41a, 43a) and the respective second joint portions (41a, 43a) of the two half tube members are provided for at least one of the two half tube member (41, 42).

Implementation Example 2

The plurality of barrier portions (44) are formed so as to cover a welded portion (P) where the first joint portions (41a, 43a) are welded to each other and a welded portion (P) where the second joint portions (41a, 43a) are welded to each other, in a direction from the inside.

Implementation Example 3

The tubular member (31) has an internal space (31a) for housing one or more electrical wires (13a, 13b), which extends in the entire length in the lengthwise direction, and each of the barrier portions (44) are formed so as to cooperatively define an empty sub space (S) with inner surfaces (41b, 43b) of the two half tube members (41, 42).

Implementation Example 4

Each of the barrier portions (44) is an arc-shaped protruding portion that bridges between the first joint portion (41a, 43a) and the second joint portion (41a, 43a).

Implementation Example 5

Each of the barrier portions (44) is a protruding portion that has a base end (44b) and a free end (44a),
the base end (44b) is located at a first position that is different from the first joint portion (41a, 43a) and the second joint portion (41a, 43a), on the inner surface (43b) of one half tube member (42) of the two half tube members (41, 42), and
the free end (44a) abuts against or is adjacent to a second position that is different from the first joint portion (41a, 43a) and the second joint portion (41a, 43a), on the inner surface (41b) of the other half tube member (41) of the two half tube members (41, 42).

Implementation Example 6

Each of the barrier portions (44) spans between the base end (44b) and the free end (44a), and includes a recessed curving surface (44c) that surrounds a welded portion (P) where the first joint portions (41a, 43a) are welded to each other or a welded portion (P) where the second joint portions (41a, 43a) are welded to each other, in a direction from the inside.

Implementation Example 7

Each of the barrier portions (44) is an elongated wall that extends along the entire length of the half tube member corresponding thereto, in the lengthwise direction.

Implementation Example 8

The plurality of barrier portions (44) are provided for only one half tube member (42) of the two half tube members (41, 42).

Implementation Example 9

The plurality of barrier portions (44) include first barrier portions that are provided for one half tube member (42) of the two half tube members (41, 42), and second barrier portions that are provided for the other half tube member (41) of the two half tube members (41, 42).

It will be apparent to those skilled in the art that the present disclosure may be embodied in other specific forms without departing from the technical concept of the present disclosure. For example, some of the components described in the embodiment (or one or more aspects thereof) may be omitted, or some components may be combined with each other.

The invention claimed is:
1. An electromagnetic shield component comprising:
a tube that is electrically conductive and into which an electrical wire is to be inserted, wherein
the tube includes a first half tube that has a shape of a half tube, a second half tube that has a shape of a half tube, and welds where both ends of the first half tube in a circumferential direction and both ends of the second half tube in the circumferential direction are welded to each other, an inner circumferential surface of the first half tube is provided with extensions that extend inward from the inner circumferential surface of the first half tube, in a radial direction of the tube, toward the second half tube, and portions of the extensions that face the welds in the radial direction are provided such that gaps are formed between the portions and the welds.

2. The electromagnetic shield component according to claim 1, wherein:

the extensions are formed at both ends of the first half tube in the circumferential direction, each of the extensions has a leading end surface that is orientated outward in the radial direction, at a leading end of the extensions in a direction in which the extensions extend, and at least a portion of the leading end surface abuts against an inner circumferential surface of the second half tube.

3. The electromagnetic shield component according to claim 2, wherein:

each of the extensions has a leading end surface that faces the inner circumferential surface of the second half tube, at a leading end of the extensions in a direction in which the extensions extend, and the leading end surface is formed so as to fit the inner circumferential surface of the second half tube that the leading end surface faces.

4. The electromagnetic shield component according to claim 1, wherein each of the extensions extends so as to curve from the inner circumferential surface of the first half tube toward the inner circumferential surface of the second half tube.

5. A wire harness comprising the electromagnetic shield component according to claim 1 and at least one electrical wire that is inserted into the electromagnetic shield component.

6. The wire harness according to claim 5, wherein:

the at least one electrical wire is a plurality of electrical wires that are inserted into the electromagnetic shield component, and the extensions are positioned so as to extend in a direction that intersects a direction in which the plurality of electrical wires are arranged side by side.

* * * * *